United States Patent [19] | [11] 3,983,425
Barlow | [45] Sept. 28, 1976

[54] TUNED PLATE ACOUSTIC PROJECTOR WITH PIEZOELECTRIC DRIVER

[75] Inventor: Michael L. Barlow, Silverdale, Wash.

[73] Assignee: The United States of America as represented by the Secretary of the Navy, Washington, D.C.

[22] Filed: Sept. 15, 1975

[21] Appl. No.: 613,715

[52] U.S. Cl. .................................. 310/8.7; 310/8.2; 310/9.1; 340/10

[51] Int. Cl.² .......................................... H01L 41/08

[58] Field of Search ............... 310/8.2, 8.3, 8.5, 8.7, 310/9.1–9.4, 26; 340/8 R, 8 MM, 9, 10, 14, 385, 191; 259/1 R, DIG. 15, DIG. 41, DIG. 44; 181/142, 157, 161, 172, 402; 179/110 A, 1 ST, 181 R

[56] References Cited

UNITED STATES PATENTS

| | | | |
|---|---|---|---|
| 1,589,962 | 6/1926 | Hecht et al. | 340/14 UX |
| 1,590,369 | 6/1926 | Hahnemann et al. | 340/14 |
| 2,541,944 | 2/1951 | Slaymaker et al. | 181/157 |
| 2,967,957 | 1/1961 | Massa | 310/9.4 |
| 3,737,690 | 6/1973 | Antonio | 310/8.2 |
| 3,846,779 | 11/1974 | Martner | 310/8.2 X |
| 3,868,954 | 3/1975 | Veda | 179/1 ST |

*Primary Examiner*—Mark O. Budd
*Attorney, Agent, or Firm*—R. S. Sciascia; Charles D. B. Curry

[57] ABSTRACT

A tuned plate acoustic projector having a tuned plate that has its periphery bonded to and supported by a housing. The outer face of the tuned plate is exposed to a fluid medium in which it is desired to generate acoustic waves. One end of a piezoelectric transducer is in contact with the central region of the inner face of the tuned plate and the other end is in contact with a mass slug that has a relatively large inertia base for the transducer. A compressive bias force is applied to the transducer to maintain the transducer in compression and to thereby prevent the generation of excessive tensile stresses in thc transducer during operation. The thickness of the tuned plate is selected or tuned so that the propagation velocity of the flexural waves in the tuned plate matches the acoustic propagation velocity of the external fluid medium. An approximately hemispherical acoustic beam is obtained in the fluid medium which is the composite of a search light beam which is generated by the piston action of the transducer against the central region of the tuned plate and a toroidal rim fire beam which is generated by the transfer of energy from the radiating flexural waves in the tuned plate into acoustic waves in the fluid medium.

8 Claims, 25 Drawing Figures

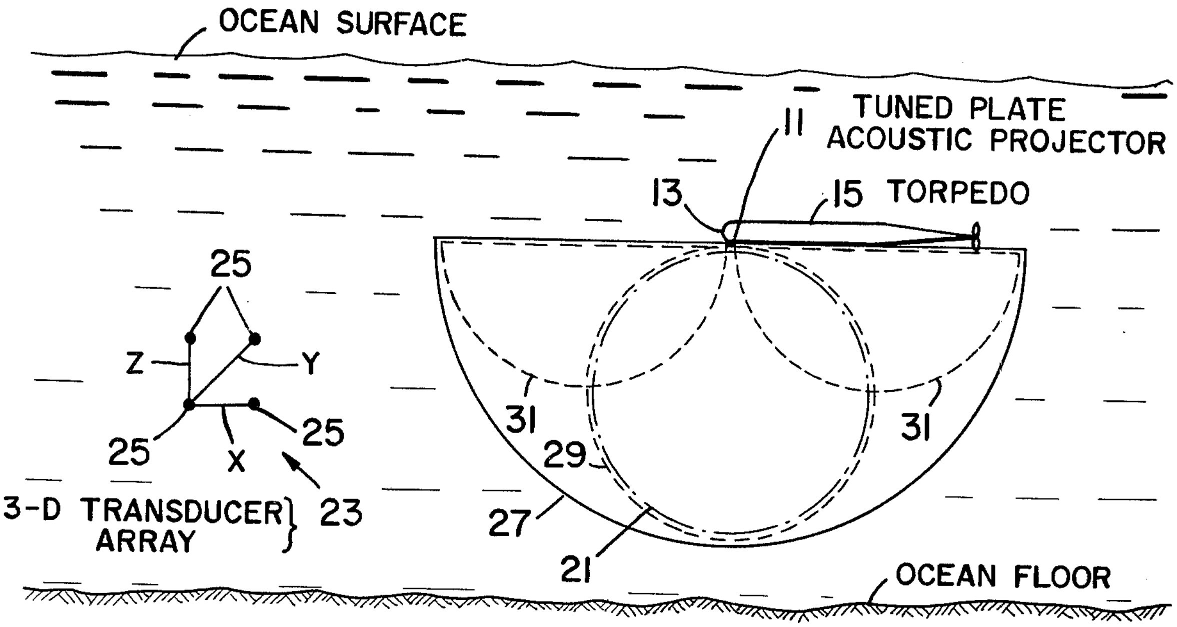
FIG_2
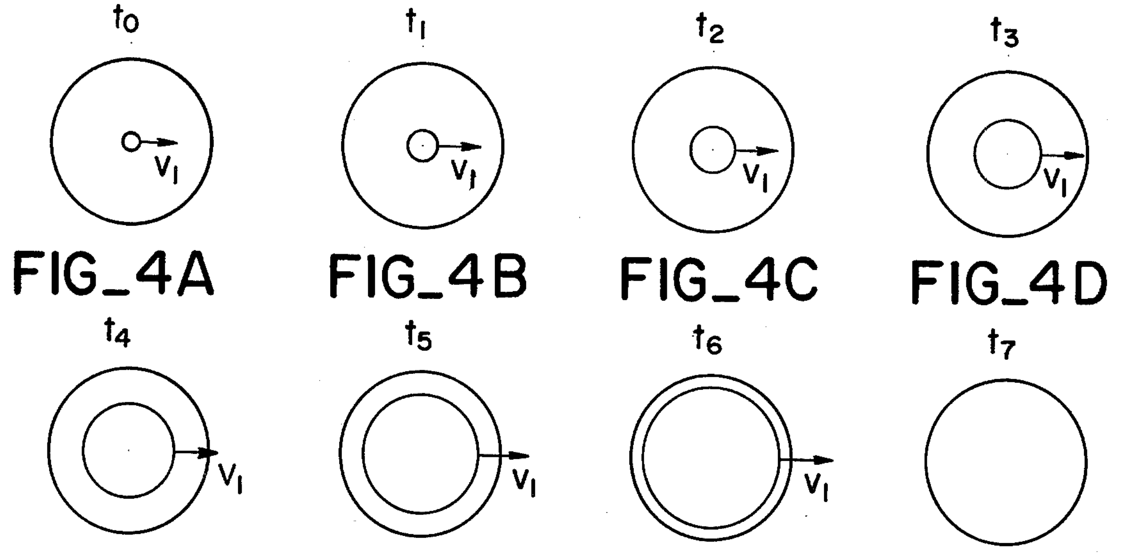
FIG_4A FIG_4B FIG_4C FIG_4D
FIG_4E FIG_4F FIG_4G FIG_4H
EQUIVALENT CIRCUIT OF PIEZOELECTRIC TRANSDUCER 39
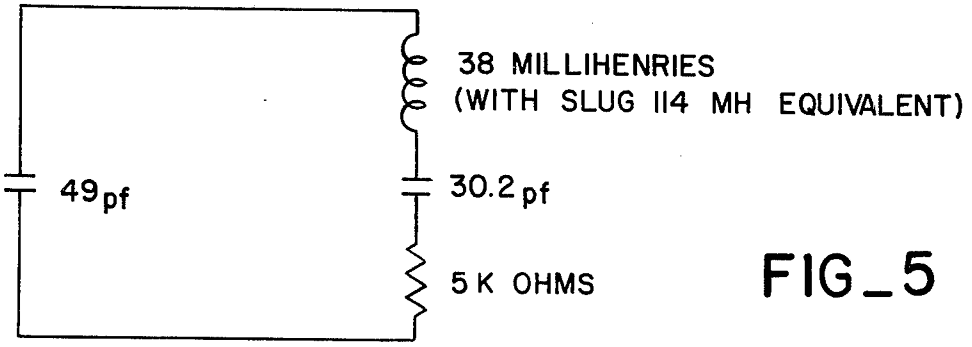
FIG_5

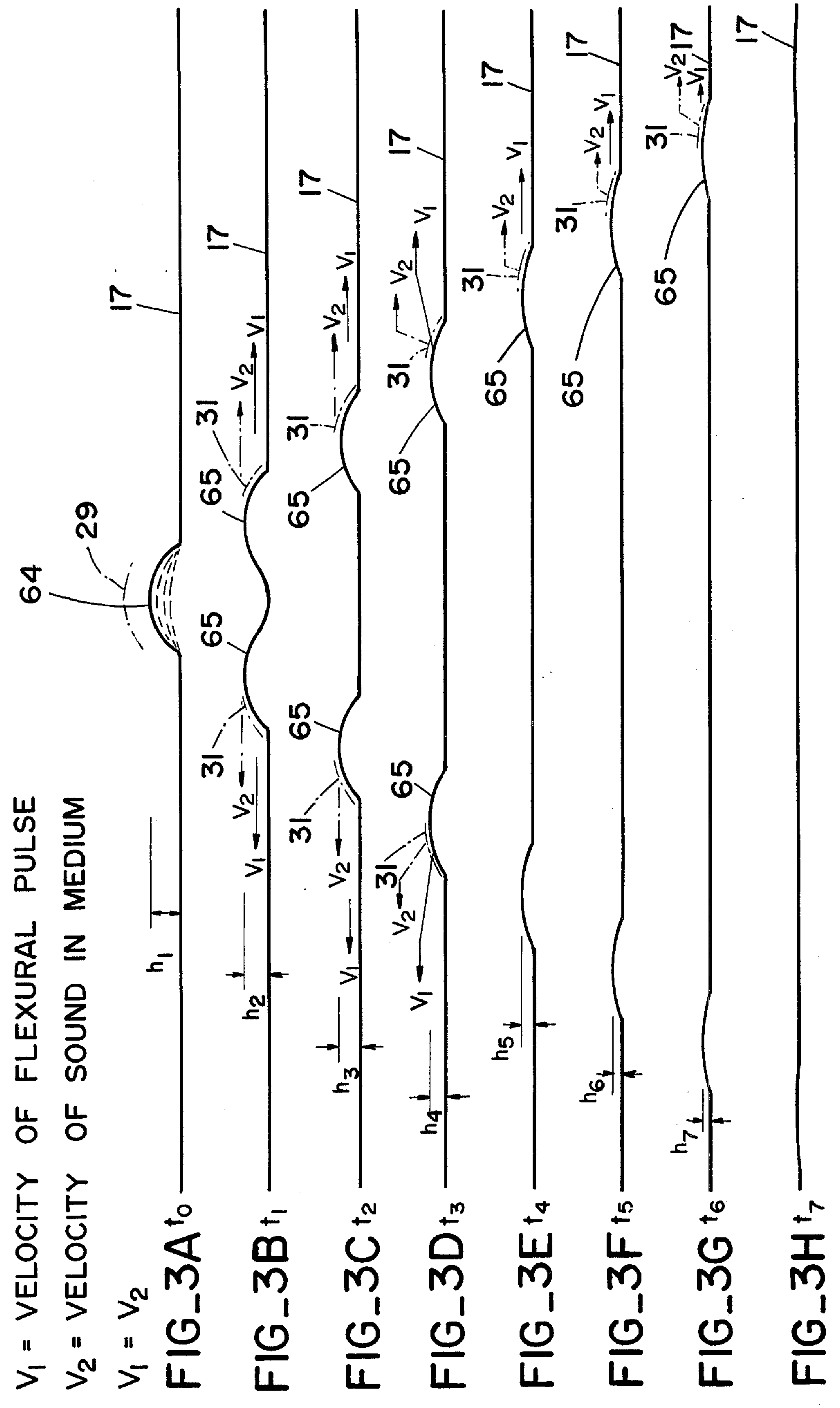
V1 = VELOCITY OF FLEXURAL PULSE
V2 = VELOCITY OF SOUND IN MEDIUM
V1 = V2
FIG_3A t0
FIG_3B t1
FIG_3C t2
FIG_3D t3
FIG_3E t4
FIG_3F t5
FIG_3G t6
FIG_3H t7
17
29
31
64
65
V1
V2
h1
h2
h3
h4
h5
h6
h7

TUNED PLATE ACOUSTIC PROJECTOR WITH PIEZOELECTRIC DRIVER

BACKGROUND OF THE INVENTION

1. Field of the Invention

The present invention relates to an acoustic projector and more particularly to a tuned plate acoustic projector that has a hemispherical beam pattern.

2. Description of the Prior Art

There has been a continuing requirement for acoustic projectors that can be mounted flush to the surface of a moving object, such as underwater ordinance, and transmit broad hemispherical beam position locating signals. In the past broad hemispherical beams have been obtained by employing array type acoustic projectors comprising a plurality of acoustic projectors. These array type projectors have been relatively complex and unreliable. Individual acoustic projectors have also been used; however, these have been quite directional and have not been able to generate broad hemispherical acoustic beams that are 90°off the axis of the acoustic projection.

The present invention overcomes these difficulties by providing a flush mounted acoustic projector that is reliable, relatively simple and generates a broad hemispherical beam that is 90° off its axis to materially aid in locating and tracking the object upon which it is mounted.

SUMMARY OF THE INVENTION

Briefly, the present invention comprises a tuned plate acoustic projector having a tuned plate that has its periphery bonded to and supported by a housing. The outer face of the tuned plate is exposed to a fluid medium in which it is desired to generate acoutic waves. One end of a piezoelectric transducer is in contact with the central region of the inner face of the tuned plate and the other end is in contact with a mass slug that has a relatively large inertia base for the transducer. A compressive bias force is applied to the transducer to maintain the transducer in compression and to thereby prevent the generation of excessive tensile stresses in the transducer during operation. The thickness of the tuned plate is selected or tuned so that the propagation velocity of the flexural waves in the tuned plate matches the acoustic propagation velocity of the external fluid medium. An approximately hemispherical acoustic beam is obtained in the fluid medium which is the composite of a search light beam which is generated by the piston action of the transducer against the central region of the tuned plate and a toroidal rim fire beam which is generated by the transfer of energy from the radiating flexural waves in the tuned plate into acoustic waves in the fluid medium.

STATEMENT OF THE OBJECTS OF THE INVENTION

An object of the present invention is to provide an acoustic projector that can be mounted underwater vehicle and provide an acoustic signal that is easily received and tracked.

Another object of the present invention is to provide an acoustic projector that is relatively reliable and simple.

Still another object of the present invention is to provide an acoustic projector that generates a broad hemispherical beam.

A further object of the present invention is to provide an acoustic projector that employs a tuned plate where the radiating flexural waves on the surface of the tuned plate generate a toroidal acoustic beam in the adjacent medium.

A still further object of the present invention is to provide an acoustic projector that simultaneously generates a search light beam and a toroidal beam to form a hemispherical beam.

Other objects, advantages and novel features of the invention will become apparent from the following detailed description of the invention when considered in conjunction with the accompanying drawings wherein:

BRIEF DESCRIPTION OF THE DRAWINGS

FIG. 2 is an illustration of the use and of the acoustic beam pattern of the tuned plate acoustic projector of the present invention;

FIGS. 3A through 3H are an illustration of a side elevation of the flexural waves established in the tuned plate of the present invention by a single impulse;

FIGS. 4A through 4H are top elevations of the flexural waves established in the tuned plate and correspond to equivalent waves shown in FIGS. 3A through 3H;

FIG. 5 is an equivalent circuit of the piezoelectric transducer employed in one embodiment of the present invention;

DESCRIPTION OF THE PREFERRED EMBODIMENT

Figure 1A:
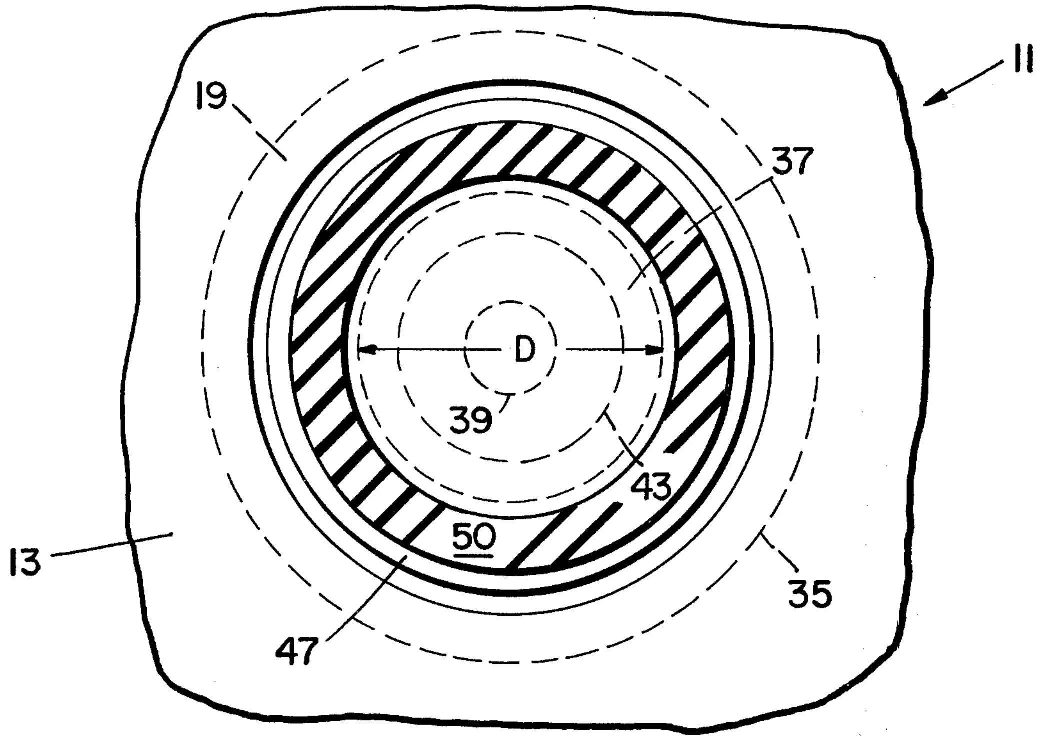
FIG. 1A is a sectional view of the tuned plate acoustic projector of FIG. 1 taken at section A—A of FIG. 1.
Figure 1:
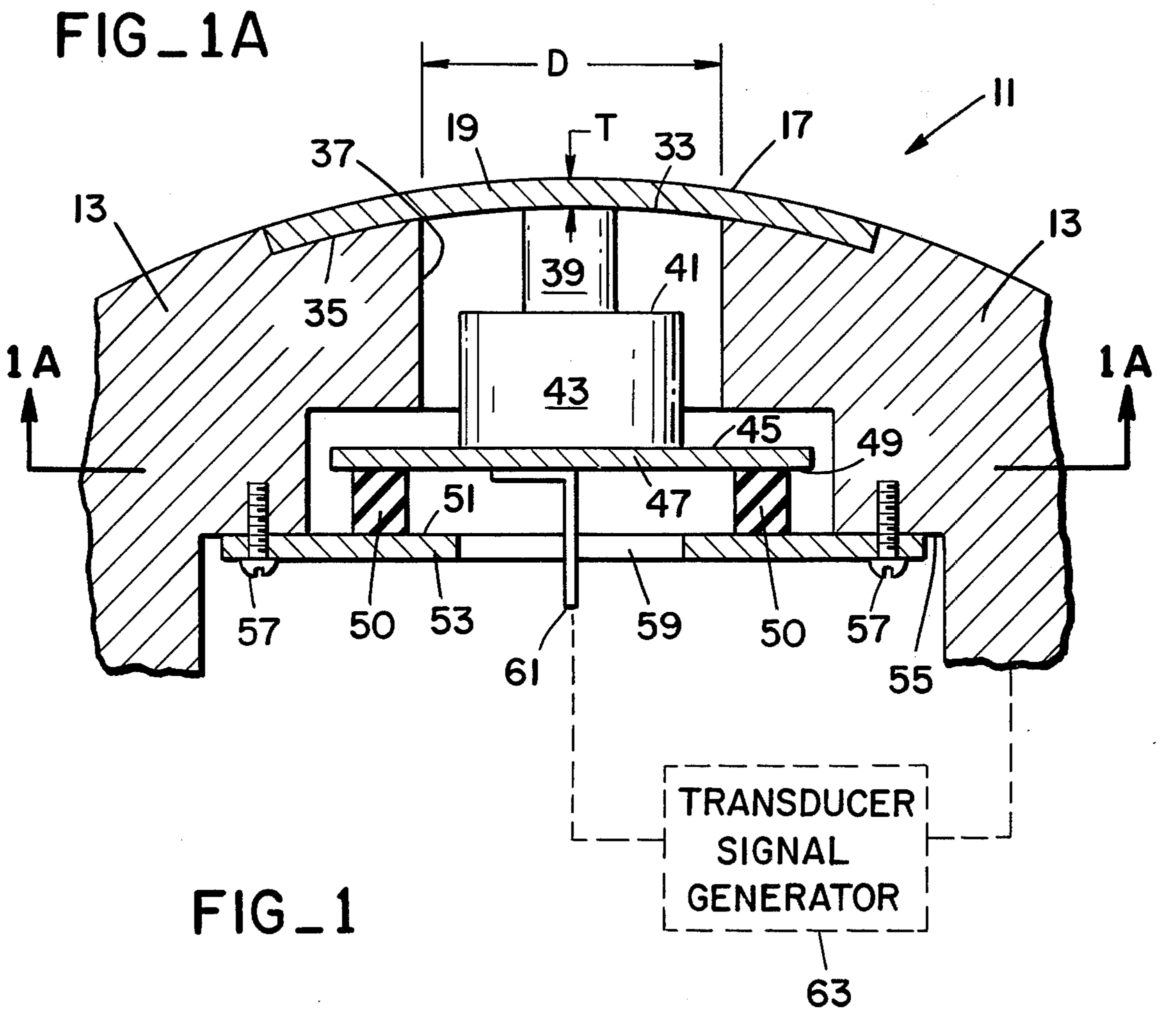
FIG. 1 is a side elevation, partly in section, of the tuned plate acoustic projector of the present invention.

In FIGS. 1 and 1A is illustrated one embodiment of the tuned plate acoustic projector 11 of the present invention. Before considering the details of the tuned plate acoustic projector 11 of FIGS. 1 and 1A reference is made to FIG. 2 which is an illustration of the beam patterns and the use of this tuned plate acoustic projector 11 on a torpedo operating in a sonar tracking range. Although the tuned plate acoustic projector 11 may be used on any moving or stationary structure, or in any acoustic transmitting fluid media such as water or air, it is shown in FIG. 2 as being flush mounted on the lower nose region of the body 13 of torpedo 15 for purpose of illustration. Referring to FIG. 1, it should be noted that the outer surface 17 of the tuned plate 19 of the projector 11 is flush with the outer torpedo surface and has a slight curvature to conform with the curvature of the torpedo surface.

Referring to FIG. 2, the normal acoustic beam pattern for previous individual acoustic projectors has been quite directional as illustrated by what is known as a search light beam 21, as shown by the broken lines. This narrow search light beam 21 is of considerable disadvantage since it will not be as radially received from an arriving or departing torpedo 15 which is being tracked by a 3-dimensional sonar array 23, for example. These 3-dimensional sonar arrays 23 typically have four acoustic receiving transducers 25 which are spaced about 30 feet apart and form the *x*, *y* and *z* axis as shown. Normally, these transducer arrays 23 are mounted on a structure, not shown, that is resting on the ocean floor and the received signals are transmitted to a remote shore location.

It is highly desirable that the torpedo mounted acoustic projector have a very broad acoustic beam so that the transducer array 23 may receive the signal as early and as late as possible, regardless of the depth or position of the torpedo 15. The tuned plate acoustic projector 11 of the present invention provides such a broad beam as illustrated by hemispherical beam 27 which is shown by a solid line. This hemispherical beam 27 is the composite of a search light beam 29, shown by a dotted line, and a toroidal rim fire beam 31, which is shown as a pair of dotted lines 31 in the two dimensional side elevation of FIG. 2. The explanation of how these beams are formed will be hereinafter described in detail. However, it should be noted that the search light beam 29 is similar to the search light beam 21 of previous acoustic projectors. Search light beam 29 is generated by the piston action (see FIG. 3A) of the tuned plate acoustic projector 11 of the present invention. The toroidal rim fire beam 31 is generated from the transfer of the energy from the flexural waves in the tuned plate 19 to form acoustic waves in the fluid medium (see FIGS. 3A through 3H). Previous acoustic projectors had piston action generated search light beams but did not have torodial rim fire beams because they did not employ tuned plates.

Referring to FIGS. 1 and 1A, the tuned plate acoustic projector 11 of the present invention includes a tuned plate 19 having an outer surface 17, an inner surface 33, a thickness T and a suspended diameter D. The outer periphery of tuned plate 19 is flush mounted in an annular slot 35 formed in body 13. The selection of the thickness T of tuned plate 19 is especially critical to the present invention as will be hereinafter explained in detail. The suspended diameter of tuned plate 19 is formed by providing a cylindrical opening 37 in body 13 that has a diameter D that is adjacent the lower surface 33 of tuned plate 19. A cylindrical piezoelectric transducer 39 has the upper surface thereof attached to the central region of the lower surface 33 of tuned plate 19. The lower surface to piezoelectric transducer 39 is centrally mounted against the upper surface 41 of mass slub 43. The lower surface of mass slug 43 is centrally mounted on the upper surface 45 of plate 47. The outer peripheral region of the lower surface 49 of plate 47 is supported by the upper surface of annular elastomeric compression washer 50. The lower surface of compression washer 50 is supported by the upper surface 51 of circular support member 53. The outer periphery of the upper surface 51 of plate 53 is held against annular shoulder 55, formed in body 13, by means of screws 57 or the like. Circular support member 53 has an opening 59 through which is inserted electrical contact tab 61. The upper surface of the electrical contact tab is connected to the lower surface 49 of plate 47. As shown by dotted lines the other end of the tab 61 is electrically connected to one output of piezoelectric signal generator 63 and the other output of generator 63 is connected to body 13.

Body 13, tuned plate 19 and plate 47 are all preferably made of aluminum or a similar non-corroding electrical conducting material. Mass slug 43 is preferably made of an electrical conducting, high density, non-corrosive material such as what is commonly known as type 304 stainless steel. Circular support plate 53 is preferably made of aluminum because it is light and non-corroding. Annular elastomeric compression washer 50 provides an upward mechanical bias force and is electrically non-conducting and is preferably made of rubber or the like.

The lower surface of piezoelectric transducer 39 is electrically connected to one side of transducer signal generator 63 through mass slug 43, plate 47 and electrical contact tab 61. The upper surface of piezoelectric transducer 39 is electrically connected to the other side of transducer signal generator 63 through tuned plate 19 and body 13. All of the electrically conducting mating surfaces are preferably mechanically and electrically interconnected by soldering, welding, using electrical conducting cement or the like. It should be noted that the upper and lower surfaces of piezoelectric transducer 39 are electrically issolated by elastomeric washer 50.

While piezoelectric transducer 39 is expanding and contracting, being driven by generator 63, it will cause the center portion of tuned plate 19 to move up and down with the mechanical expansion and contraction of piezoelectric transducer 39. This will also result in the generation of flexural waves, initially radiating outward, in tuned plate 19. The flexural waves on upper surface 17 of tuned plate 19 interacts with the medium adjacent upper surface 19 and will generate the previously described toroidal rim fire beam 31 of FIG. 2. It has been discovered that this will be achieved when the radiating propagating velocity of the flexural waves is about the same as the speed of sound of the medium in which it is placed. The details of this operation will be hereinafter described under the heading "Operation and Theory of Operation."

The piezoelectric transducer 39 will be typically operated with 1.3 milisecond pulses of 75 kilohertz frequency. The applied voltage may be from about 1 to 10 kilovolts, for example, and the maximum axial motion of the piezoelectric transducer 39 may be of the order of ±0.000001 inch at 75KHz, for example.

It is necessary to maintain piezoelectric transducer 39 under compressive loading during its positive and negative cycles of operation. For several reasons, one of which is mechanical stress limit of the piezoelectric transducer itself, it is desirable to maintain this compressive loading within the range of from about 30 to 50 pounds. To achieve this objective, when tuned plate acoustic transducer 11 is assembled, annular elastomeric compression washer 50 will exert an upward force of about 30 to 50 pounds, for example. The elastomeric material is selected to have a low modulus of elasticity and will therefore maintain the piezoelectric transducer 39 under a compressive loading that varies only slightly from the 30 to 50 pounds compressive loading while it is mechanically oscillating ±0.000001 inch. It has been found that to achieve this proper compressive loading using relatively rigid materials requires very close tolerances of mating parts.

The function of mass slug 43 is to provide a relatively large inertia with respect to the forces exerted by piezoelectric transducer 39 during operation. That is, the weight of mass slug 43 is selected to be sufficient to provide a nearly stable base for transducer 39 during operation and therefore piezoelectric transducer 39 will apply most of its motion to tuned plate 19 and not to mass slug 43. However, mass slug 43 will move slightly since it is not a fixed member.

The dimensions and characteristics of one embodiment of the tuned plate acoustic projector 11 shown in FIGS. 1 and 1A are as follows:

| | |
|---|---|
| Piezoelectric Transducer 39 | |
| material | PZT-4 |
| height | 0.375 inch |
| diameter | 0.375 inch |
| applied signal | 1,000 volts, 1.3 |
| milisecond pulses at 75 KHz, | 15 to 200 watts |
| mechanical movement | approximately |
| 0.000001 inch | |
| equivalent circuit is shown in FIG. 5 where the mass slug 43 provides an equivalent inductance of a 114 millihenries. | |
| Tuned plate 19 | |
| material | 6061-T6 - Aluminum |
| thickness T | 0.12 inch |
| unsupported diameter D | 1.4 inches |
| total diameter | 2.4 inches |
| radius of curvature | 9.5 inches |
| Mass slug 43 | |
| diameter | 0.75 inch |
| height | 0.625 inch |
| material | 304 stainless steel |
| Plate 47 | |
| material | 6061-T6 Aluminum |
| diameter | 1-3/4 inches |
| thickness | 1/8 inch |
| Annular compression washer 50 | |
| outside diameter | 1-5/8 inches |
| inside diameter | 1 inch |
| height | 3/8 inch |
| material | neoprene 55 DUR |
| Circular support plate 53 | |
| outside diameter | 2-5/16 inches |
| inside diameter | 3/4 inch |
| thickness | 1/8 inch |
| material | 6061-T6 Aluminum |
| Body 13 | |
| material | 6061-T6 Aluminum |
| diameter D | 1.4 inches |

Figure 6:
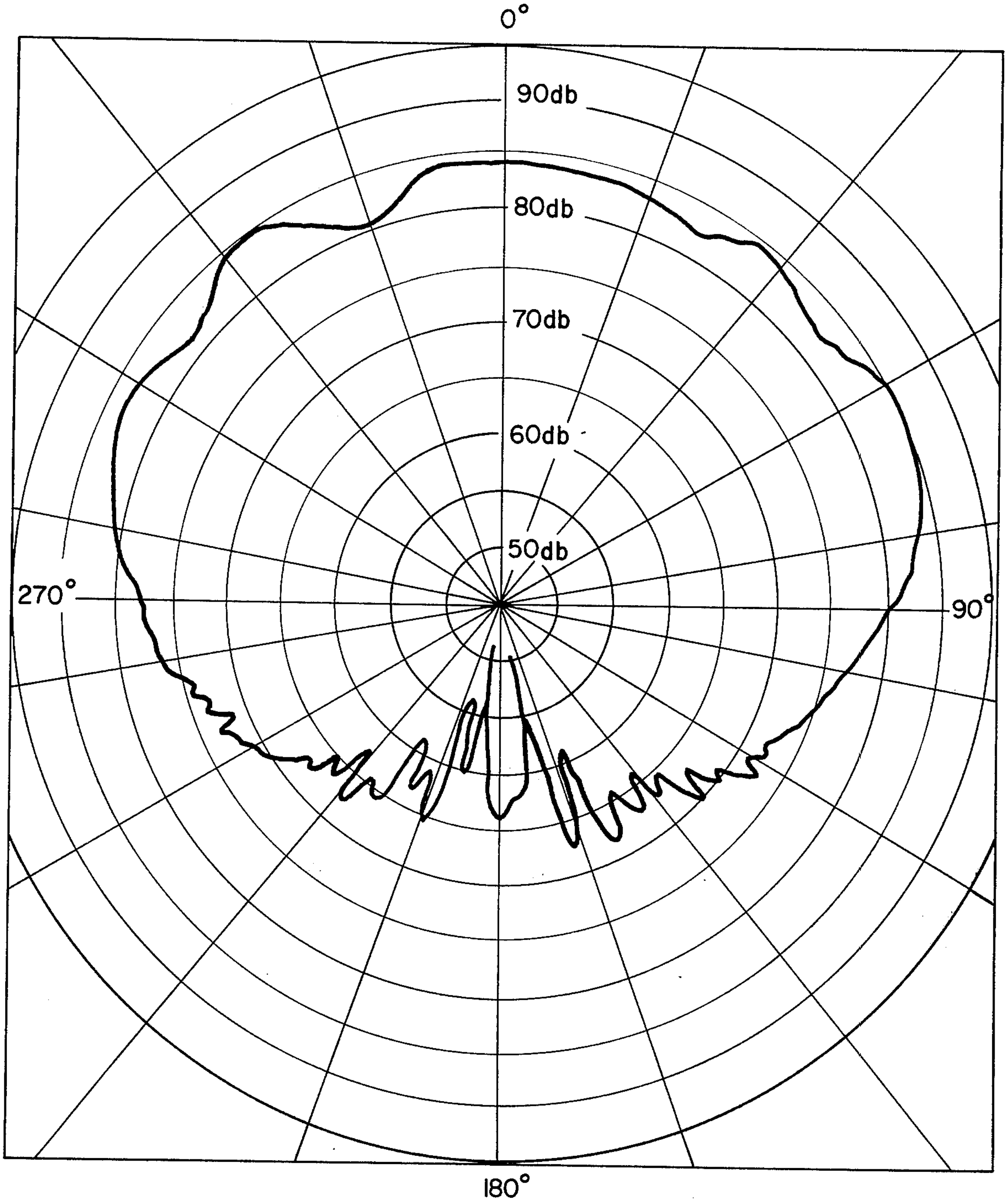
FIG. 6 is an actually measured beam pattern of the tuned plate acoustic projector of the present invention.

The embodiment of tuned plate acoustic projector 11 of the present invention having the above described or equivalent characteristics resulted in the measure hemispherical beam as shown in FIG. 6.

The conditions of this test were as follows:

| | |
|---|---|
| Seawater temperature | 6.5°C |
| Frequency | 75 KHz |
| Distance between projector and receiving hydrophone | 4.57 meters |
| Depth | 3.66 meters |
| Power | 17 watts |
| Acoustic source level output | 85.1 dbu at one yard at 0° |
| Beam pattern test | 360° |

It should be noted that substantial departure from the above described characteristics may be made provided they remain compatible with the basic requirement of selecting the proper thickness for the tuned plate 19 which will be dependent upon the material from which it is made, the frequency of operation, and the acoustic velocity of the medium in which it is operating. The means for selecting the proper tuned plate thickness (T) to achieve a fluxeral wave velocity that is about equal to the velocity of sound in the medium will be described below. It should be noted that the tuned plate may be flat or have a slight radius of curvature as shown in FIG. 1 or it may have a hemispherical shape also having a slight radius of curvature. The design criteria are essentially the same with only negligible difference for these different configurations.

OPERATION AND THEORY OF OPERATION

Figure 7A:
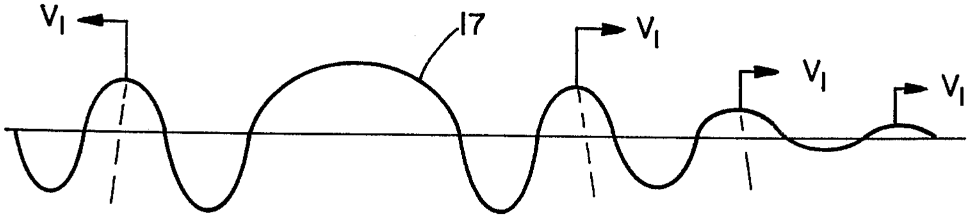
FIG. 7 is a side elevation of the upper surface of the tuned plate showing the complex pattern of flexural waves established by a plurality of sequential pulses.
Figure 7B:
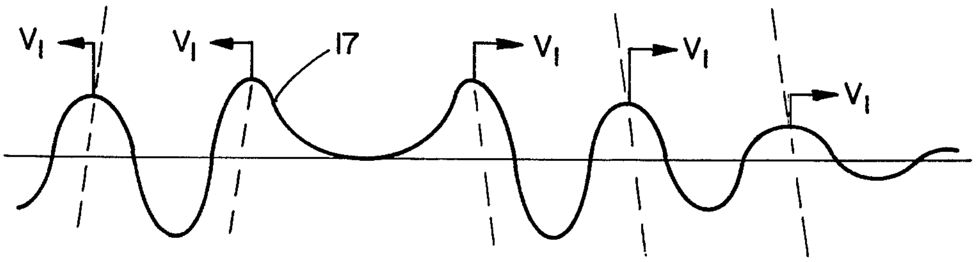
Figure 7C:
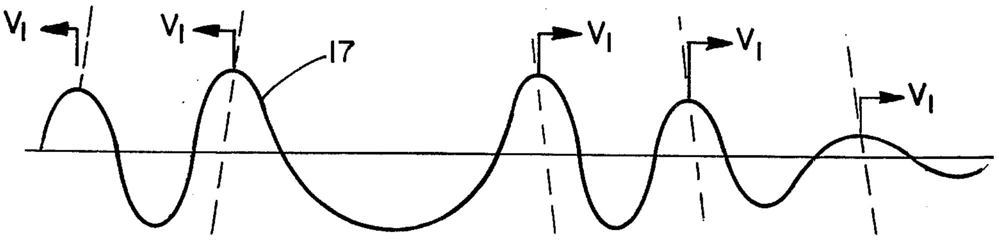
Figure 7D:
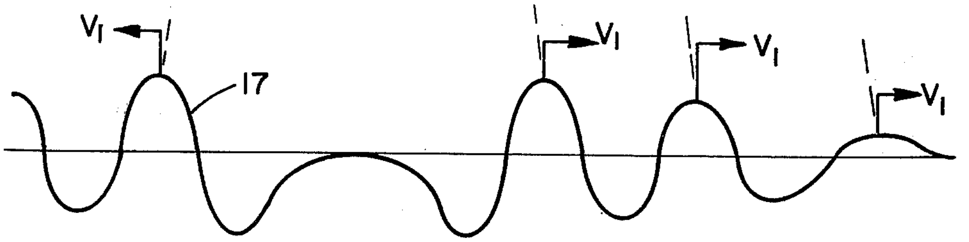

A simplified theory of operation can be explained by reference to FIGS. 3A through 3H and FIGS. 4A through 4H. The corresponding letter references of FIG. 3 and FIG. 4 relate to equivalent time of flexural position conditions. An initial impulse 64, caused by piezoelectric transducer 39, occurs at time $t_0$ and causes the upper surface 17 of tuned plate 19 to flex in the manner shown in FIG. 3A, which is a side elevation, and in FIG. 4A, which is a top elevation. By proper section of the thickness of tuned plate 19, as hereinafter described, the initial pulse will cause the tuned plate 19 to propagate radially outward an annular flexural mechanical wave 65, as illustrated in FIGS. 3B through 3G and FIGS. 4B through 4G. These FIGS. show the position and amplitude of the flexural wave 65 as a function of time $t_1$ through $t_6$ and illustrate that the amplitude $h_2$ through $h_7$ of the flexural wave 65 is attenuated until it become completely dampened as illustrated in FIGS. 3H and 4H. It should be particularly noted that the flexural wave has a velocity $V_1$ which is the same as the medium velocity $V_2$. This causes the generation of a sound wave, shown in dotted lines and identified as toroidal beam 31, having a velocity $V_2$ that propagates radially outward. Without having the velocity $V_1$ of the annular propagating flexural wave 65 equal to the velocity of sound in the medium $V_2$, a radiating sound wave and the resulting toroidal beam 31 are not generated. From this it can be seen that the initial pulse 64 generates the searchlight beam 29 and the annular propagating flexural wave 65 generates a toroidal beam 31 which together form a hemispherical beam 27 as ideally shown in FIG. 2. The process may be then repeated. In actual practice the flexural wave from the upper surface 17 of plate 19 will be much more complex than illustrated in FIGS. 3 and 4. That is, transducer 39 generates a continuous series of positive and negative pulses at a frequency of 75KHz. Therefore, this will result in a continuously radially propagating series of waves as illustrated in FIGS. 7A through 7D. FIG. 7A shows the peak upward position of transducer 39, FIG. 7B shows the neutral position following the maximum positive peak, FIG. 7C shows the peak downward position of transducer 39 and FIG. 7D shows the neutral position following the maximum negative peak. This results in a radially outward series of flexural waves at any single point in time.

It has been found that the unsupported diameter D of the tuned plate is not critical. However, it is preferable that the diameter be selected to be sufficiently large so that the waves become dampened to a negligible amount at the periphery and a significant rim fire beam is generated. The diameter may be selected so that the flexural waves that are reflected from the periphery will reinforce the outwardly moving flexural waves. However, it is to be understood that this tuning of the reflected waves to reinforce the outwardly propagating waves is not generally critical since the outwardly propagating waves substantially predominate over the reflected waves. It is to be understood that reflected waves may be further reduced to a negligible value by using energy absorbing structure at the outer periphery where the tuned plate is mechanically supported. The unsupported diameter D will be limited by the hydrostatic pressure that plate 19 is required to withstand.

The thickness T of the tuned plate 19 is determined by the relationship:

$$T = \frac{C^2}{2\pi f}\left[\frac{E}{12\rho(1-\upsilon^2)}\right]^{1/2}$$

where:
$T$ = thickness of tuned plate 19 — meters
$C$ = medium propagation velocity — meters/second
$f$ = operating frequency of transducer — Hz
$E$ = young modulus of tuned plate material — newtons/square meter
$\rho$ = density of tuned plate material — kilograms/meters$^3$
$\upsilon$ = poissons ratio for tuned plate material — dimensionless.

For the previously given example the thickness T of tuned plate 19 was found to be:

$$T = \frac{1,500}{2\,(75,000)}\left[\frac{7.1 \times 10^{10}}{12 \times 2.7 \times 10^3(1-.3^2)}\right]^{1/2}$$

$T = 3.08 \times 10^{-3}$ meters or 0.12 inch.

For additional information concerning properties of vibrating plates, reference is made to the following sources: *Physical Foundations of Technical Acoustics*, by I. Malecki, Pergamen Press, Copyright 1969 (See especially chapter 11.); and *Vibrations and Sound*, by Philip M. Morse, McGraw-Hill Book Company, Inc., Copyright 1948 (See chapter 5.).

What is claimed is:

1. An acoustic projector comprising:
a. a plate having a lower surface an an upper surface;
b. said plate having the periphery supported by a structure and an unsupported central section;
c. said upper surface being exposed to an acoustic transmitting medium;
d. motion generating means for imparting an upward motion to the lower surface of the unsupported central section of said plate;
e. said plate having a predetermined thickness; whereby
f. said thickness is selected such that the ourwardly radiating velocity of the flexural waves imparted by said means is about equal to the velocity of sound of said medium.

2. The projector of claim 1 wherein:
a. said motion generating means is a piezoelectric transducer.

3. The projector of claim 2 including:
a. support means for maintaining said piezoelectric transducer in about constant compressive loading against said inner surface of said plate.

4. The projector of claim 3 wherein:
a. said support means includes an elastomeric member.

5. The projector of claim 4 wherein:
a. said support means includes a mass slug having an upper surface and a lower surface;
b. said piezoelectric transducer being positioned between and in contact with said lower surface of said plate and said upper surface of said mass slug; whereby
c. said mass slug is supported by and forced against said piezoelectric transducer by said elastomeric material.

6. The projector of claim 5 wherein:
a. said support means includes a support plate; and
b. said support plate is positioned between said lower surface of said mass slug and said elastomeric member.

7. The projector of claim 6 wherein:
a. the initial upward motion of said piezoelectric transducer against said plate generates a directional acoustic beam in a direction about vertical to said upper surface of said plate; and
b. said radiating flexural waves generate a toroidal acoustic beam radiating outwardly about horizontal to said upper surface of said plate; whereby
c. the resultant acoustic beam generated by said directional acoustic beam and said toroidal acoustic beam is a hemispherical beam propagating outward from said upper surface of said plate.

8. The projector of claim 7 wherein:
a. said piezoelectric transducer is pulsed with at least one pulse at a predetermined frequency which result in a plurality of flexural waves simultaneously radiating outward from the center of said plate at a velocity that is about equal to the velocity of sound in said medium.

* * * * *